(12) United States Patent
Wang et al.

(10) Patent No.: US 6,778,107 B2
(45) Date of Patent: Aug. 17, 2004

(54) METHOD AND APPARATUS FOR HUFFMAN DECODING TECHNIQUE

(75) Inventors: Wen-Shan Wang, Chandler, AZ (US); Ping-Sing Tsai, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 253 days.

(21) Appl. No.: 09/944,353

(22) Filed: Aug. 30, 2001

(65) Prior Publication Data

US 2003/0052802 A1 Mar. 20, 2003

(51) Int. Cl.[7] .................................................. H03M 7/40
(52) U.S. Cl. ........................................... 341/65; 341/67
(58) Field of Search ........................ 341/65, 67, 106, 341/107, 79, 95

(56) References Cited

U.S. PATENT DOCUMENTS

| | | | | |
|---|---|---|---|---|
| 4,646,061 A | * | 2/1987 | Bledsoe | 341/65 |
| 4,700,175 A | * | 10/1987 | Bledsoe | 341/65 |
| 4,899,149 A | * | 2/1990 | Kahan | 341/67 |
| 5,329,313 A | | 7/1994 | Keith | |
| 5,467,088 A | * | 11/1995 | Kinouchi et al. | 341/65 |
| 5,559,831 A | * | 9/1996 | Keith | 375/240 |
| 5,615,020 A | | 3/1997 | Keith | |
| 5,696,563 A | * | 12/1997 | Rosenberg | 348/699 |
| 5,970,177 A | * | 10/1999 | Chinnock | 382/244 |
| 5,973,626 A | * | 10/1999 | Berger et al. | 341/65 |
| 6,292,114 B1 | | 9/2001 | Tsai et al. | |
| 6,297,754 B1 | * | 10/2001 | Miyasaka et al. | 341/65 |
| 6,563,439 B1 | * | 5/2003 | Acharya et al. | 341/65 |

OTHER PUBLICATIONS

Acharya et al., A Method of Performing Huffman Decoding, Oct. 31, 2002.*
U.S. patent application Ser. No. 09/704,380, Acharya, et al., filed Oct. 31, 2000.
U.S. patent application Ser. No. 09/704,392, Acharya, et al., filed Oct. 31, 2000.
U.S. patent application Ser. No. 09/705,314, Acharya, et al. filed Nov. 3, 2000.

* cited by examiner

*Primary Examiner*—Brian Young
*Assistant Examiner*—John B Nguyen
(74) *Attorney, Agent, or Firm*—Paul E. Steiner

(57) ABSTRACT

Numerous embodiments for a method of performing Huffman decoding are disclosed.

30 Claims, 6 Drawing Sheets

| New Data structure 1 – NDS1[ ] | | |
|---|---|---|
| NDS1[bits] | Ref_Code | Base_Index |
| NDS1[1] | 111111 | -1 |
| NDS1[2] | 111111 | -1 |
| NDS1[3] | 000000 | 0 |
| NDS1[4] | 011000 | 3 |
| NDS1[5] | 111000 | 11 |
| NDS1[6] | 111110 | 14 |

(a)

| New Data structure 2 – NDS2[ ] | | |
|---|---|---|
| NDS2[bits] | Base_Code | Base_Index |
| NDS2[1] | 111111 | -1 |
| NDS2[2] | 111111 | -1 |
| NDS2[3] | 000 | 0 |
| NDS2[4] | 0110 | 3 |
| NDS2[5] | 11100 | 11 |
| NDS2[6] | 111110 | 14 |

(b)

| Symbol | Huffman Code I | Huffman Code II | Huffman Code III | Huffman Code IV |
|--------|----------------|-----------------|------------------|-----------------|
| S0     | 0              | 0               | 1                | 1               |
| S1     | 10             | 11              | 01               | 00              |
| S2     | 11             | 10              | 00               | 01              |

| Symbol | Length (bits) | Huffman code |
|---|---|---|
| S0 | 5 | 11100 |
| S1 | 0 | - |
| S2 | 0 | - |
| S3 | 0 | - |
| S4 | 4 | 0110 |
| S5 | 4 | 0111 |
| S6 | 4 | 1000 |
| S7 | 4 | 1001 |
| S8 | 3 | 000 |
| S9 | 4 | 1010 |
| S10 | 4 | 1011 |
| S11 | 3 | 001 |
| S12 | 3 | 010 |
| S13 | 5 | 11101 |
| S14 | 4 | 1100 |
| S15 | 6 | 111110 |
| S16 | 4 | 1101 |
| S17 | 5 | 11110 |
| S18 | 6 | 111111 |

Figure 3

| Symbol | Codeword |
|---|---|
| a | 00 |
| b | 01 |
| c | 100 |
| d | 101 |
| e | 110 |
| f | 1110 |
| g | 11110 |
| h | 11111 |

Encoding Table

Decoding Tree

| Memory Address | | Output | |
|---|---|---|---|
| Node | Input | Next-Node/ [Codeword] | Termination Flag |
| 0 | 0 | 5 | 0 |
| 0 | 1 | 1 | 0 |
| 1 | 0 | 6 | 0 |
| 1 | 1 | 2 | 0 |
| 2 | 0 | [e] | 1 |
| 2 | 1 | 3 | 0 |
| 3 | 0 | [f] | 1 |
| 3 | 1 | 4 | 0 |
| 4 | 0 | [g] | 1 |
| 4 | 1 | [h] | 1 |
| 5 | 0 | [a] | 1 |
| 5 | 1 | [b] | 1 |
| 6 | 0 | [c] | 1 |
| 6 | 1 | [d] | 1 |

| Index | Symbol | Length (bits) | Huffman code |
|---|---|---|---|
| - | S1 | 0 | - |
| - | S2 | 0 | - |
| - | S3 | 0 | - |
| 0 | S4 | 3 | 000 |
| 1 | S11 | 3 | 001 |
| 2 | S12 | 3 | 010 |
| 3 | S8 | 4 | 0110 |
| 4 | S5 | 4 | 0111 |
| 5 | S6 | 4 | 1000 |
| 6 | S7 | 4 | 1001 |
| 7 | S9 | 4 | 1010 |
| 8 | S10 | 4 | 1011 |
| 9 | S14 | 4 | 1100 |
| 10 | S16 | 4 | 1101 |
| 11 | S15 | 5 | 11100 |
| 12 | S13 | 5 | 11101 |
| 13 | S17 | 5 | 11110 |
| 14 | S19 | 6 | 111110 |
| 15 | S18 | 6 | 111111 |

Figure 6

| New Data structure 1 – NDS1[ ] | | | | New Data structure 2 – NDS2[ ] | | |
|---|---|---|---|---|---|---|
| NDS1[bits] | Ref_Code | Base_Index | | NDS2[bits] | Base_Code | Base_Index |
| NDS1[1] | 111111 | -1 | | NDS2[1] | 111111 | -1 |
| NDS1[2] | 111111 | -1 | | NDS2[2] | 111111 | -1 |
| NDS1[3] | 000000 | 0 | | NDS2[3] | 000 | 0 |
| NDS1[4] | 011000 | 3 | | NDS2[4] | 0110 | 3 |
| NDS1[5] | 111000 | 11 | | NDS2[5] | 11100 | 11 |
| NDS1[6] | 111110 | 14 | | NDS2[6] | 111110 | 14 |

(a)                                                  (b)

METHOD AND APPARATUS FOR HUFFMAN DECODING TECHNIQUE

RELATED APPLICATIONS

This application is related to U.S. patent application Ser. No. 09/704,380, titled "A Method of Performing Huffman Decoding", by Acharya, et al., filed Oct. $31^{st}$, 2000, and U.S. patent application Ser. No. 09/704,392, titled "A Method of Generating Huffman Code Length Information", by Acharya, et al., filed Oct. $31^{st}$, 2000, both of which are assigned to the assignee of the present invention and herein incorporated by reference.

BACKGROUND

1. Field

This disclosure relates to Huffman decoding.

2. Background Information

As is well-known, Huffman coding is a popular variable length statistical encoding scheme. As is also well-known, Huffman code generation relies on statistical probabilities for each individual symbol. See, for example, D. A. Huffman, "A Method for the Reconstruction of Minimum-Redundancy Codes", Proceedings of the IRE (Institute of Electrical and Radio Engineers), Volume 40, No. 9, pages 1098–1101, 1952. A traditional table lookup based encoding scheme is widely used for Huffman encoding due, at least in part, to its efficiency and relative ease of implementation. However, table searching based decoding is typically inefficient in both software and hardware implementations. This is especially the case when the number of entries in a table is reasonably high, as is typical for practical applications.

Another approach employed for Huffman decoding is the creation of a Huffman tree, which employs a "tree traversing technique." However, this decoding technique also has disadvantages. This particular technique is bit sequential, and introduces extra "overhead" both in terms of memory allocation and the execution of computations for the Huffman tree generation process and for the decoding process.

BRIEF DESCRIPTION OF THE DRAWINGS

The subject matter is particularly pointed out and distinctly claimed in the concluding portion of the specification. The claimed subject matter, however, both as to organization and method of operation, together with objects, features, and advantages thereof, may best be understood by reference to the following detailed description when read with the accompanying drawings in which:

FIG. 3 is a table illustrating an example of Huffman codes in which selected rules have been applied to uniquely determine the Huffman code;

FIG. 6 is a table using the information from the table of FIG. 3 where a different organization has been applied.

DETAILED DESCRIPTION

In the following detailed description, numerous specific details are set forth in order to provide a thorough understanding of the claimed subject matter. However, it will be understood by those skilled in the art that the claimed subject matter may be practiced without these specific details. In other instances, well-known methods, procedures, components and circuits have not been described in detail so as not to obscure the claimed subject matter.

As previously indicated, the Huffman code generation process relies upon the statistical probabilities of occurrence of the individual symbols in a given set. Generation of Huffman codes for a set of symbols is based at least in part on the probability of occurrence of these symbols. Typically, the construction of a binary tree, referred to in this context as a Huffman tree, is employed. D. A. Huffman, in the aforementioned paper, describes the process this way:

1. List all possible symbols with their probabilities;
2. Find the two symbols with the smallest probabilities;
3. Replace these by a single set containing both symbols, whose probability is the sum of the individual probabilities;
4. Repeat until the list contains only one member.

This procedure produces a recursively structured set of sets, each of which contains exactly two members. It, therefore, may be represented as a binary tree ("Huffman Tree") with the symbols as the "leaves." Then to form the code ("Huffman Code") for any particular symbol: traverse the binary tree from the root to that symbol, recording "0" for a left branch and "1" for a right branch. One issue, however, for this procedure is that the resultant Huffman tree is not unique. One example of an application of such codes is text compression, such as GZIP. GZIP is a text compression utility, developed under the GNU (Gnu's Not Unix) project, a project with a goal of developing a "free" or freely available UNIX-like operation system, for replacing the "compress" text compression utility on a UNIX operation system. See, for example, Gailly, J. L. and Adler, M., GZIP documentation and sources, available as gzip-1.2.4.tar at the website http://www.gzip.org/.

As is well-known, the resulting Huffman codes are prefix codes and the more frequently appearing symbols are assigned a smaller number of bits to form the variable length Huffman code. As a result, the average code length is ultimately reduced by taking advantage of the frequency of occurrence of the symbols.

Figures 1, 2:
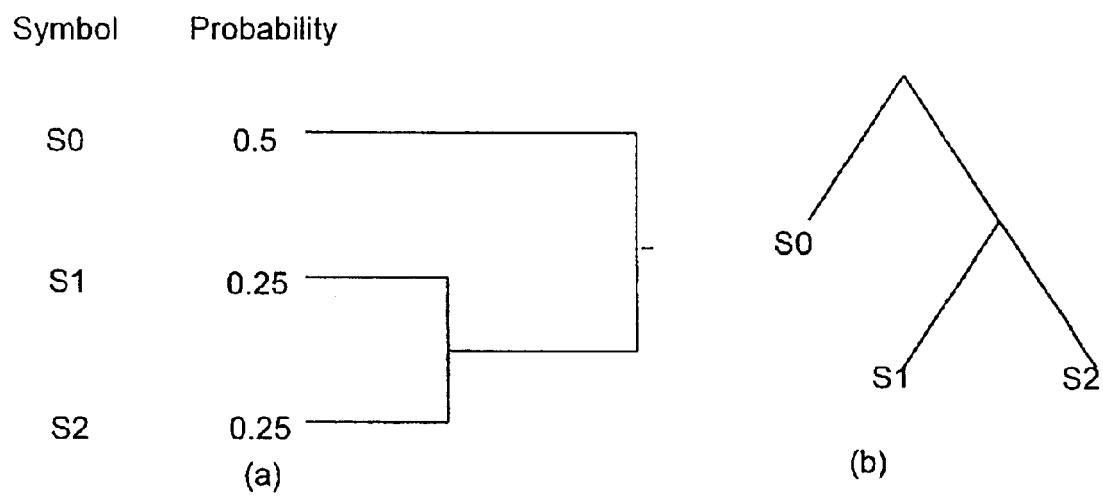
FIG. 1 is an example of Huffman tree construction and the associated Huffman tree.
FIG. 2 is a table illustrating the possible Huffman codes for the Huffman tree of FIG. 1.

FIG. 1 illustrates a simple example of a Huffman tree with three source symbols. The same Huffman tree may be represented using several binary codes by assigning different binary symbols to the edges of the tree.

The possible set of Huffman codes for this Huffman tree is illustrated in FIG. 2. From FIG. 2, it is demonstrated that Huffman codes are not unique although, it appears from this example, that the individual code length of each symbol is unique.

One may generate the length information for the Huffman codes by constructing the corresponding Huffman tree. However, as previously indicated, Huffman codes may not be unique when generated in this fashion, even though the length information may be unique. Nonetheless, it may be shown that by imposing two additional restrictions, the Huffman code produced by employing the Huffman tree may be assured of being unique. These restrictions are:

1. All codes of a given bit length have lexicographically consecutive values, in the same order as the symbols they represent; and
2. Shorter codes lexicographically precede longer codes.

Based on these restrictions, a Huffman code may be uniquely determined. FIG. 3, for example, shows a Huffman code set of 19 symbols employing these restrictions, where the code lengths are predetermined using the Huffman tree. For the table of FIG. 3, a dash in an entry in the Huffman code table shows that the code by the symbol in the current source alphabet does not exist and its length information is zero.

Although the claimed subject matter is not limited in scope in this respect, the foregoing restrictions have been employed in various compression approaches and standards, such as in the previously described utility, GZIP, for example. Typically, in such applications, the Huffman tree information is passed in terms of a set of code length information along with compressed text data. Therefore, the set of code length information is sufficient to reconstruct a unique Huffman tree. The Huffman code table illustrated in FIG. 3 for example, may be generated using the following process, as implemented in GZIP.

The code lengths are initially in Length[I];

1) Count the number of codes for each code length.
   Let "count[N]" be the number of codes of length N, where N >= 1.
2) Find the numerical value of the smallest code for each code length:
   Huffman_code = 0; count[0] = 0;
   for (i = 1 to MAX_BITS) {
       Huffman_code = (Huffman_code + count[i-1]) << 1;
       next_code[i] = Huffman_code;
   }
3) Assign numerical values to all codes, using consecutive values determined in 2.

As previously indicated, Huffman decoding may be accomplished relatively easily and efficiently using a table lookup technique in situations where there are relatively few encoded words. However, in practical applications, the decoding of Huffman codes is typically more computationally intensive because when encoded code words are received in a compressed bit stream to be decoded, there are no predefined boundaries between the encoded code words. The traditional table based decoding scheme is very inefficient, particularly when the number of entries in an associated table is relatively large. Huffman codes are variable length codes, as previously described.

One approach or technique, referred to as a constant input rate decoder or bit-serial approach, processes the input bit stream serially, one bit at a time. This method employs the construction of a decoding Huffman tree. Therefore, starting from the root, the technique involves traversing the branches of the decoding tree until a terminal node is reached. At the terminal node, the encoded code word is fully decoded and the corresponding symbol may, therefore, be produced or output as desired. This process then begins again from the root of the tree. See, for example, "Image and Video Compressions Standards: Algorithms and Architectures", by B. Bhaskarin and K. Konstantinides, Kluwer Academic Publishers, 1995.

Figures 4, 5:
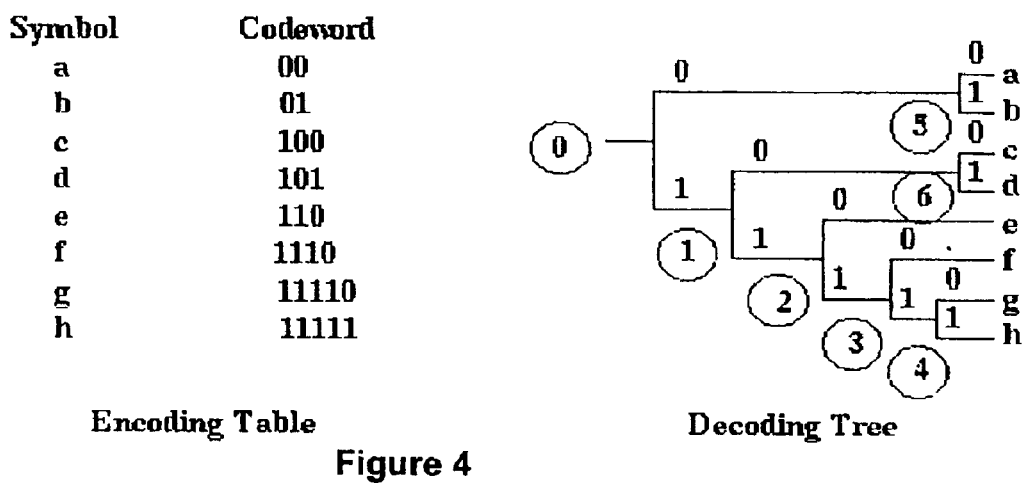
FIG. 4 is an example of a Huffman encoding table with the corresponding decoding tree.
FIG. 5 is a table illustrating read only memory (ROM) entries for bit serial Huffman decoding.

FIG. 4 is an example of a Huffman encoding table with the corresponding decoding tree. One problem associated with such a decoder in hardware or software is how to efficiently map the decoding tree into memory. For example, FIG. 5 illustrates a table of read only memory (ROM) entries for bit serial Huffman decoding using the decoding tree of FIG. 4.

One approach to efficiently mapping memory was proposed for example, by Mukherjee et al., "MARVLE: a VLSI chip for data compression using tree-based codes," IEEE Transactions on Very Large Scale Integration (VLSI) System, 1(2):203–214, June 1993.

Another approach, though not particularly efficient, for decoding the Huffman code, is to compare each entry of the Huffman table with input bits in the input buffer. Under this approach, at worst, N entries in the encoding table will be compared for the decoding of each encoded code word, where N is the total number of symbols. In addition, the code length information for the entry must be known. This approach typically will incorporate a comparison technique where encoded code words are compared serially, or one code word at a time, and each encoded code word is typically compared to each entry of the Huffman table one at a time. This serial approach to decoding may not be particularly efficient, as explained previously.

Although the claimed subject matter is not limited in this respect, one embodiment employs a parallel matching decoding scheme to decode a set of associated encoded Huffman code words. In this context, parallel matching refers to a code word comparison wherein an encoded code word is compared to at least two entries of an associated data structure at substantially the same time. In an alternative embodiment, more associated encoded code words are compared to their respective associated entries in a data structure at substantially the same time. These, of course, are just two possible embodiments of the claimed subject matter, however. In this context, comparing refers to a mathematical manipulation or comparison of one or more code words, for example a subtraction of one word from another, or determining which value is numerically greater, but the claimed subject matter is not limited in this respect. An advantage of this embodiment is that there is no need for the table search or generation of an associated Huffman tree described above, for example, and in this embodiment, decoding is not performed serially, one bit at a time. In this particular embodiment of Huffman encoding, the two additional restrictions previously indicated may be included in the Huffman encoding process.

The data structure that is utilized for Huffman code decoding in one embodiment comprises the associated Huffman code for the sequentially first code words in a group of code words of the same code lengths. The data structure also includes the sequential position of the associated first code word in the overall grouping of all code words for a particular data structure.

FIG. 6 is a Huffman table, or data structure, derived from the original table, which is shown in FIG. 3. The values in FIG. 6 are obtained by sorting the code words in FIG. 3 into groupings of words with the same code word length, and also sorting the code words in these groupings in ascending order. The highlighted rows of FIG. 6 demonstrate what data may be carried into another data structure for use in an embodiment. As demonstrated in FIGS. 7(a) and (b), and explained in more detail hereinafter, at least two different types of data structures may be derived from a data structure as displayed in FIG. 6, by selecting at least one of the categories of data from FIG. 6 and incorporating at least a portion in another data structure. In this embodiment, FIG. 7(a) comprises a table of values called NDS1[K], or 'New Data Structure 1', in this embodiment, where K is the number of entries, or the number of code words with distinct Huffman code word lengths in an associated table. As can be seen in FIG. 7(a), the data taken from FIG. 6 to produce the values in FIG. 7(a) comprise a reference code (Ref_Code)

and a base index (Base_Index), although the claimed subject matter is not limited in this respect. The reference code, in one embodiment, comprises the Huffman code of the first code word in a grouping of Huffman code words of the same length, but with the Huffman code words having '0' bits added, or shifted left, until the total number of bits in a reference code is as long as the Huffman code word comprising the longest bit length for a code word in an associated data set. For example, if the first code word in a grouping of Huffman code words that were three bits in length were '111', and the longest bit length Huffman code word in the data set were 6 bits long, then the reference code for the grouping of Huffman code words 3 bits long would be '111000'. As can be seen from FIG. 7(a), the reference code that represents a Huffman code length that has no associated code words in a data set may be represented by a series of '1' values that are the same length as the longest Huffman code in an associated data set. In an alternative embodiment, the Huffman code length that has no associated code words in a data set may be represented by the same value used by the longest Huffman code. It will, of course, be understood that this is just one embodiment and these values are not required or even employed in all embodiments of the claimed subject matter.

In FIG. 7(a), the base index is obtained from FIG. 6, and represents the sequential position of the lexicographically first Huffman code word in a grouping of Huffman codes of the same bit length in an associated data structure. As can be seen in FIG. 7(a), the base index may be equal to the value '−1' when there are no Huffman codes for a particular length, but this is not required or even employed in all embodiments. It can be seen in FIG. 7(a) that the table NDS1[ ] also comprises variables NDS1[k] using a one-based index, where k represents the kth element of the data structure array NDS1[ ], and comprises the reference code and the base index for Huffman code words k bits in length. For example, from FIG. 7(a), NDS1[4] employs the reference code '011000', and the base index 3. These values will be used to decode the 4 bit Huffman code from an associated encoded binary digital signal shown in FIG. 7(a). In this particular embodiment, the value in brackets represents the number of useful bits for an associated reference code. "Useful bits", here, refers to the bit length for the set of Huffman code words associated with a particular data structure, here, NDS1, value. For example; NDS1[4] is associated with a set of Huffman code words that have 4 useful bits, or comprise Huffman code words 4 bits in length. Although, as stated previously, the associated reference code may not be exactly 4 bits in length, as the length will be the same as the code word in a set of associated code words having the greatest length.

FIG. 7(b), another data structure in accordance with another embodiment, comprises a table of values called NDS2[K], or 'New Data Structure 2', where K is the number of entries with distinct code length. This particular embodiment may be implemented in hardware or software, but the claimed subject matter is not limited in this respect. FIG. 7(b) comprises a base code and a base index, and is derived, in this embodiment, from FIG. 6. As can be seen in FIG. 7(b), the base code (Base_Code) represents the lexicographically first Huffman code in a set of Huffman code words of the same bit length. It can be seen in FIG. 7(b) that when there are no associated Huffman code words of a given length, the base code may be represented by a series of '1' values equal in length to the length of the longest Huffman code in an associated set of Huffman code words. In this embodiment, the base index (Base_Index) represents the sequential position of the lexicographically first Huffman code word in a grouping of Huffman code words of the same bit length in an associated data structure. As can be seen in FIG. 7(b), the base index may be equal to the value '−1' when there are no Huffman codes for a particular length, but this is not required or employed in all embodiments. It can be seen in FIG. 7(b) that the table NDS2[ ] also comprises variables NDS2[k] using a one-based index, where k represents the kth element of the data structure array NDS2[ ], and comprises the reference code and the base index for Huffman code words k bits in length. For example, from FIG. 7(b), NDS2[4] employs the reference code '0110', and the base index 3. These values will be used to decode the 4 bit Huffman code from an associated encoded binary digital signal shown in FIG. 7(b). In this particular embodiment, the value in brackets represents the number of useful bits for an associated reference code, and is also a one-based index that may be utilized in accordance with the present embodiment, where the index represents the number of useful bits for an associated data structure. "Useful bits", here, refers to the bit length for the set of Huffman code words associated with a particular data structure, here, NDS2, value. For example, NDS2[4] is associated with a set of Huffman code words that have 4 useful bits, or comprise Huffman code words 4 bits in length. Although, as stated previously, the associated reference code may not be exactly 4 bits in length, as the length will be the same as the code word in a set of associated code words having the greatest length.

As can be seen from FIG. 7(a) or FIG. 7(b), the amount of data employed in the data structure is less than the entire set of data shown in FIG. 3 or FIG. 6 that would be used in some of the aforementioned commonly known decoding techniques.

This particular embodiment of a decoding process may be implemented in software, but the claimed subject matter is not limited in this respect. For example, the present embodiment may be implemented in hardware or firmware, as just an example. In this particular embodiment, the data structure shown in FIG. 7(a) may be utilized. Here, a number of incoming bits are received as encoded binary digital signals. The number of bits received, before proceeding with further processing, is equal to the total number of bits in the longest Huffman code word in an associated data structure when no prior bits have been received, in this embodiment. In alternative embodiments, however, the length may be equal to the shortest Huffman code word, and in this context, the shortest or longest code word lengths in a set of code words may be referred to as extreme length code words. In the present embodiment, in subsequent receipts of incoming bits, the number of bits received will be equal to the number of bits in the longest Huffman code word, minus any bits that were remaining that were not decoded in prior iterations, again, in this embodiment. For example, if 6 bits are received as encoded binary digital signals as an initial receipt of data, and the code word decoded from these bits were 4 bits in length, there would be 2 bits remaining that were not decoded, and in the next receipt of bits, 4 bits will be received as encoded binary digital signals. In this particular embodiment, values of the Ref_Code and Base_index, shown in FIG. 7(a), are used in conjunction with the foregoing parallel matching. It will, of course, be understood that the present embodiment is not limited to a software implementation, but could comprise firmware, hardware, or other embodiments.

In accordance with one embodiment, the bit groups or code words are decoded in parallel by comparing an incoming bit group or code word with two or more reference codes at substantially the same time, where the reference codes are derived from an associated data structure, represented, in this particular embodiment, by FIG. 7(a). In this particular embodiment, the incoming encoded binary digital signal is parallel processed in groups of bits wherein the first bit group is derived from taking the number of bits from an input buffer, where the incoming encoded binary digital signal is equal to the number of bits in the longest code word in an associated data structure, as stated previously. The second, and all subsequent bit groups are obtained in substantially the same manner as the first bit group, for this embodiment. These bit groups are then processed in parallel in accordance with this particular embodiment, and in this context, parallel comparison refers to the substantially simultaneous comparison of a bit group with two or more reference codes in an associated data structure at substantially the same time. It will, of course, be understood that the claimed subject matter is not limited to just parallel processing, for example, series processing could be incorporated in accordance with an alternative embodiment of the claimed subject matter, or there may be only one reference code in an associated data structure, and this would not comprise parallel processing in this context.

In this particular embodiment, the incoming encoded binary digital signal is compared, or processed, in parallel with two or more reference codes in order to determine useful code length. Useful code length is determined, in this embodiment, substantially by:

1. If the incoming encoded binary digital signal is greater than or equal to the reference code of only one process, the corresponding bit length of that process is selected.
2. If the incoming encoded binary digital signal is greater than or equal to the reference codes of more than one process, the corresponding bit length of the highest priority process is selected.

As just an example of the software embodiment described previously, if the code word lengths in a particular set of Huffman code words were represented by FIG. 7(a), the lengths of the Huffman code words are 3, 4, 5, and 6 bits. The corresponding base indexes are —1, –1, 0, 3, 11 and 14 for processes 1, 2, 3, 4, 5, and 6 respectively. Similarly, the reference codes are 111111, 111111, 000000, 011000, 111000, and 111110 for processes 1, 2, 3, 4, 5 and 6, respectively. If the incoming encoded binary digital signal were 11010, then compared data pairs in the process would be {111111, 111010}, {111111, 111010}, {000000, 111010}, {01000, 111010}, {111000, 111010}, and {11110, 111010} respectively. These compared data pairs are compared at substantially the same time, or parallel processed, as explained previously. From the pairs as shown, the incoming Huffman code word is greater than the reference code for processes 3, 4 and 5. However, the useful bit length of incoming binary data may be determined as 5, because process 5 has the highest priority. Priority, in this context, refers to the process that is performed before any other process in an associated decoding scheme.

In this particular embodiment, if the incoming bit group is greater than or equal to the aforementioned reference code, then the reference code with the highest priority, if there is more than one reference code satisfying this condition, is used to compute the offset. The offset is then added to the aforementioned base index, which in this particular embodiment, is the relative position in the Huffman symbol table of the first Huffman code word within a grouping of Huffman code words of the same length. In this particular embodiment, when the offset is added to the base index, the decoded Huffman symbol may be found, or matched, in the position provided by the resultant value as compared with a data structure such as, in this embodiment, FIG. 6, for example. In this embodiment, the input buffer comprises an input pointer, which tracks how many bits have been input into the input buffer, so that when the next input signal is received, that signal comprises the bits that have not yet been decoded. The process of receiving a number of bits from the incoming encoded binary digital signal is repeated until the encoded binary digital signal has substantially been decoded by the process described in this particular embodiment. Although the claimed subject matter is not limited to a software implementation, the following pseudo code shows a software implementation in accordance with this particular embodiment.

```
Begin
Set N = the longest code length;
Set the arbitration of m for all processes as follows:
      Process N has highest priority, process N-1 has second highest, and so on.
do{
      Tmp_code = N bits from the input buffer;
      M = 0;
      Fork              // N processes commit a parallel run
         Process N:
               If ( NDS[N]. Ref_code <= tmp_code) m = N;
         Process N - 1
               If ( NDS[N - 1]. Ref_code <= tmp_code) m = N - 1;
         (...........)
         (...........)
         Process 2:
               If ( NDS[2]. Ref_code <= tmp_code) m = 2;
         Process 1:
               If ( NDS[1]. Ref_code <= tmp_code) m = 1;
      Join     //end of parallel run
      if ( m > 0 ){/*symbol found */
         Offset = ((temp_code >> (N - m)) - (NDS[m].Ref_code >> (N-m));
         Get the Symbol at the index location (NDS[m].Base_Index + Offset);
         Output Symbol;
         Move the current pointer position in the input buffer forward m bits;
      }
      else Error;       /* no symbol found */
} while (not the end of input bit stream);
End
```

In one embodiment, a decoding process may be implemented substantially in accordance with the preceding pseudo code. Although the claimed subject matter is not limited in this respect, the preceding pseudo code is capable of being implemented in the C programming language or other types of suitable programming languages, although, as stated, previously, the claimed subject matter in not limited in this respect. Additionally, it will be understood that this embodiment is not limited to parallel processing, but could be implemented in a series or sequential process.

Figures 7, 8:
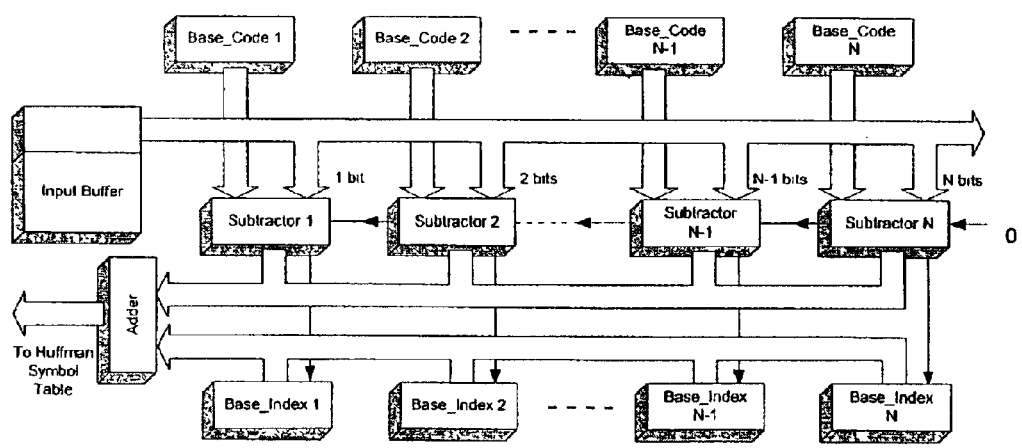
FIGS. 7($a$) and ($b$) are tables respectively illustrating two data structures for a hardware and software embodiment of a Huffman decoding technique.
FIG. 8 is a schematic diagram illustrating a hardware implementation of a data structure for one embodiment.

In another embodiment, although the claimed subject matter is not limited in this respect, the decoding scheme may be implemented in computer hardware. FIG. 8 shows a block diagram that represents one possible embodiment that may be used in order to implement one embodiment in hardware. In this particular embodiment, at least a portion of a data structure is loaded into at least one base code and base index register or block shown in FIG. 8. In this particular embodiment, FIG. 7(b) represents one possible data structure that can be loaded into the base code and base index registers in FIG. 8. The aforementioned data structure (NDS2[K]), represented by FIG. 7(b) in this embodiment, comprises a base code and a base index. As stated previously, in this embodiment, the base code comprises Huffman code words for the first code words within a grouping of sequentially grouped Huffman code words of a particular length. The base index, in this embodiment, represents the relative position of the first code word for a grouping of code words in an associated Huffman table, represented in this embodiment by FIG. 6.

In this particular embodiment, the number of base code blocks, shown in FIG. 8, is equal to the total number of individual code word groups in an associated data structure, To although the claimed subject matter is not limited in this respect. As stated previously, FIG. 7(b) represents a data structure that can be incorporated to load data values in one possible hardware embodiment. It will, of course, be understood that the number of base code or base index register blocks is not limited to the total number of individual code word groups, but this is just one possible embodiment.

In this particular embodiment, individual subtractors receive the number of bits equal to the number of bits comprising a code word in the set of code words in the subgrouping it represents, at substantially the same time. For example, if the subtractor were used in a grouping of code words that are 3 bits long, the subtractor would receive the first 3 bits of an encoded binary digital signal. It will, of course, be understood that the claimed subject matter is not limited in this respect, however. Subtractors, in this embodiment, are individual processes that subtract at least one value from at least one other value. Subtractors are well known in the art, and well-known methods may be used to construct one or more subtractors in hardware or software. It will, of course, be understood that the invention is not limited to any particular type of subtractor, however.

Figure 9:
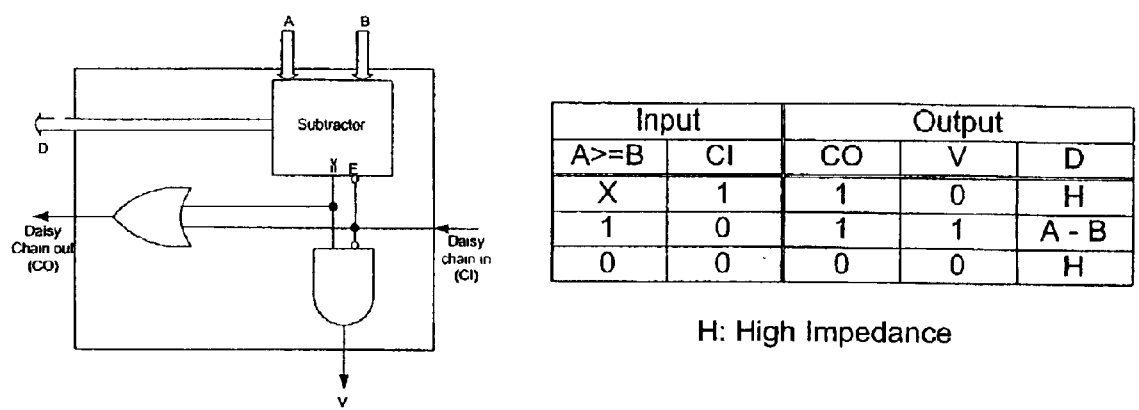
FIG. 9 is a schematic diagram illustrating a daisy chain subtractor for one embodiment and a corresponding logic table.

In this particular embodiment, the base code provides input signals to the associated subtractors, and the input buffer provides a second input signal to the associated subtractors. In this particular embodiment, a subtractor contains a daisy chain circuit. As is well-known, a daisy chain circuit couples multiple gates or other logic devices, and is capable of providing sequential control of a system of logic devices, an example of which is shown in FIG. 9. In this particular embodiment, the daisy chain circuits are incorporated to ensure that a subtractor will output a difference value, and in this particular embodiment the subtractor that represents the bit grouping with the largest number of bits has the highest priority. The daisy chain circuit, as shown in FIG. 9, also provides that an output signal from an associated subtractor and base index is received in the adder.

In this particular embodiment, one of the functions of the subtractors is to compare their associated base codes with the associated input signal from the input buffer, at substantially the same time. If the input signal from the input buffer is greater than or equal to the base code, the subtractor will provide an output signal, which will comprise the mathematical difference of the input buffer data and the base code. This difference value is supplied to the adder block in this particular embodiment.

In this particular embodiment, as seen in FIG. 9, a daisy chain out (CO), couples with the daisy chain in (CI) of the next subtractor. In this particular embodiment, the first daisy chain signal (CI), which is the daisy chain signal in of subtractor N, is logic 0. The logic 0 propagates to the CI of the sequential subtractor, for example N–1, N–2, and so on, until the difference of the input buffer and base code for an associated subtractor is either positive or 0. In this particular embodiment, the subtractor will provide an output signal to the adder provided two conditions are met:

1. the encoded binary digital signal received from the input buffer is greater than or equal to the base code.
2. the daisy chain in (CI) signal is logic 0.

In this particular embodiment, if the above two conditions are met, the subtractor will provide an output signal to the adder. Additionally, the subtractor daisy chain circuit will provide a logical '1' input signal to the associated base index. The base index, which, as stated previously, is the relative position of the first Huffman code word within a set of Huffman code words of the same length within a grouping of Huffman code words, will provide an output signal to the adder upon receipt of a logical '1' signal.

The adder module, upon receipt of an input signal from an associated subtractor and base index, will provide a summation result, which may be used to locate a decoded symbol in an associated Huffman table. The summation result, in this particular embodiment, comprises the index value that may be used to determine, or match, what the decoded symbol is for an associated Huffman code word, as seen in FIG. 6.

As just an example of the hardware embodiment described previously, using FIG. 6 and FIG. 7(b), if the encoded binary digital signal was 11101010, or a combination of symbols S13 and S12 from FIG. 6, and there were code words which were 3, 4, 5, and 6 bits in length in an associated data structure, then in the hardware embodiment there would be subtractors 3, 4, 5, and 6, representing Huffman codes words 3, 4, 5, and 6 bits in length respectively. The input signals to the subtractors, respectively, would be the encoded binary digital signal and the base codes from FIG. 7(b) as follows: {111, 000}, {1110, 0110}, {11101, 11100}, {111010, 111110}. These data sets would be compared at substantially the same time, as explained previously. In this example, the subtractor 5 signal, with the difference D=1 and the Base Index 5 with value 11, as shown in FIG. 7(b), will be sent to the adder. The index 12 references FIG. 6, which indicates symbol S13 correctly.

As another example of a hardware embodiment in accordance with one embodiment, the possible code word lengths in the Huffman code word set shown in FIG. 7(b) are 3, 4, 5 and 6 bits. Therefore, the contents of the base index registers are—1, –1, 0, 3, 11 and 14 for code word lengths 1, 2, 3, 4, 5 and 6, respectively. Similarly, the contents of base code registers are 111111, 111111, 000, 0110, 11100, and 111110 for code word lengths 1, 2, 3, 4, 5 and 6 respectively. If the incoming encoded binary digital signal were 111010, then the binary digital signals that are input into the subtractors are 1, 11, 1110, 11101, and 111010 respectively. In other words, the input pairs into for the subtractors are {111111, 1}, {111111, 11}, {000, 111}, {0110, 1110}, {11100, 11101} are {111110, 111010} respectively. These input pairs are compared at substantially the same time, or in parallel, as explained previously. From the input pairs, it can be seen that the incoming encoded binary digital signal is greater than the base code data for subtractors 3, 4 and 5. The output signal of the difference of subtractor 5 will be provided, however, because subtractor 5 has the highest priority, as stated previously.

It will, of course, be understood that the embodiment described above are just a few possible embodiments of the claimed subject matter, and the claimed subject matter is not limited to just these embodiments. The claimed subject matter is not limited to just Huffman codes or Huffman decoding, but could be used in a variety of other coding schemes.

While certain features of the claimed subject matter have been illustrated as described herein, many modifications, substitutions, changes, and equivalents will now occur to those skilled in the art. It is, therefore, to be understood that the appended claims are intended to cover all such embodiments and changes as fall within the true spirit of the claimed subject matter.

What is claimed is:

1. A method of decoding a series of encoded binary digital signals using a data structure, said data structure having multiple base indices, said method comprising:
   selecting N encoded binary digital signals, N being a value comprising substantially the same number of bits as the number of bits comprising an extreme length code word in said data structure;
   comparing said N encoded binary digital signals with two or more entries from said data structure at substantially the same time.

2. The method of claim 1, and further comprising, after the previous comparison:
   selecting M encoded binary digital signals for subsequent comparisons, M being a value comprising substantially the same number of bits as the number of bits comprising an extreme code word in said data structure, minus the number of bits that were not decoded in the previous comparison; and
   comparing said M encoded binary digital signals with two or more entries from said data structure at substantially the same time.

3. The method of claim 2, and further comprising:
   repeating said selecting M encoded binary digital signals and said comparing M encoded binary digital signals until said encoded binary digital signals are substantially decoded.

4. The method of claim 1, wherein the binary digital signals are encoded in accordance with Huffman code.

5. The method of claim 1, wherein the data structure is organized, at least in part, based on code length.

6. The method of claim 1, wherein the data structure is organized in sub groupings of code words having the same code length, the sub groupings being arranged sequentially.

7. The method of claim 1, wherein said extreme length code word comprises the shortest code word in said data structure.

8. The method of claim 1, wherein said extreme length code word comprises the longest code word in said data structure.

9. A method of decoding a series of encoded binary digital signals using a data structure, said data structure having multiple base indices and multiple base codes, said method comprising:
   selecting a set of N encoded binary digital signals, N being a value at least as great in length as an associated base code, wherein a set of N encoded binary digital signals is selected for substantially each base code in an associated data structure; and
   comparing one or more said sets of N encoded binary digital signals with the associated base codes at substantially the same time.

10. The method of claim 9, and further comprising, after the previous comparison:
    selecting a set of M encoded binary digital signals for subsequent comparisons, M being a value at least as great in length as an associated base code, wherein a set of M encoded binary digital signals is selected for substantially each base code in an associated data structure; and
    comparing one or more said sets of M encoded binary digital signals with the associated base codes at substantially the same time.

11. The method of claim 10, and further comprising:
    repeating said selecting M encoded binary digital signals and said comparing M encoded binary digital signals until said encoded binary digital signals are substantially decoded.

12. The method of claim 9, wherein the binary digital signals are encoded in accordance with a Huffman code.

13. The method of claim 9, wherein the data structure is organized, at least in part, based on code length.

14. The method of claim 9, wherein the data structure is organized in sub groupings of code words having the same code length, the sub groupings being arranged sequentially.

15. An apparatus for decoding a series of encoded binary digital signals comprising:
    at least one base code register and at least one base index resister, wherein said registers are configured to read values from an associated data structure by applying the contents of said registers to an input signal, to produce an index;
    at least one subtractor;
    at least one daisy chain circuit; and
    at least one adder, wherein said at least one subtractor is configured to receive at least a portion of the contents of said at least one base code register, and is configured to receive one or more encoded binary digital signals, wherein said at least one daisy chain circuit is coupled to said at least one subtractor, and is configured to provide an output to said at least one base index register, wherein said at least one adder is configured to receive an input from said at least one base index register and said at least one subtractor.

16. The apparatus of claim 15, wherein said at least one subtractor, said at least one adder, and said at least one daisy chain circuit are embodied on a single integrated circuit.

17. The apparatus of claim 15, wherein said adder is configured to access an associated data structure and use said index to substantially decode at least one code word.

18. A data structure of code words, the code words being arranged in sub groupings, comprising at least one of the following:
    code word length;
    base code;

reference code; and base index, wherein the reference code comprises the base code of the corresponding set of code words, wherein the base code comprises a length substantially equal to the length of an extreme length base code for a given set of code words.

19. A data structure of code words, the code words being arranged in sub groupings, comprising at least one of the following:

code word length;

base code;

reference code; and base index, wherein the base index comprises the number of individual Huffman codes that are contained within a given set of Huffman code words.

20. A data structure of code words, the code words being arranged in sub groupings, comprising at least one of the following:

code word length;

base code;

reference code; and base index, wherein the base index is equal to the value (−1) in the corresponding set of Huffman values if there are no corresponding Huffman codes of the corresponding length.

21. A method of creating a data structure for decoding code words, said method comprising:

sorting said code words by code length;

ordering the code words of the same lengths sequentially;

maintaining the code of the initial code word of a set of code words of a particular length and the total number of code words of the same length; and determining a base index for at least one sub grouping of code words, wherein the base index comprises the lexicographically consecutive position of the first code word of a given sub grouping within the entire set of code words.

22. A method of creating a data structure for decoding code words, said method comprising:

sorting said code words by code length;

ordering the code words of the same lengths sequentially;

maintaining the code of the initial code word of a set of code words of a particular length and the total number of code words of the same length; and determining a base code for at least one sub grouping of code words, wherein the base code comprises the lexicographically first code word in a given sub grouping within the entire set of code words.

23. An article comprising:

a storage medium having stored thereon instructions, that when executed by a computing platform, result in a method of decoding a series of binary digital signals using a data structure, wherein said data structure has multiple base indices, being executed, said method comprising:

selecting N encoded binary digital signals, N being a value comprising substantially the same number of bits as the number of bits comprising an extreme code word in said data structure;

comparing said N encoded binary digital signals with two or more entries from said data structure at substantially the same time.

24. The article of claim 23, having stored thereon instructions that when executed further result in:

after the previous comparison:

selecting M encoded binary digital signals for subsequent comparisons, M being a value comprising substantially the same number of bits as the number of bits comprising an extreme code word in said data structure, minus the number of bits that were not decoded in the previous comparison; and comparing said M encoded binary digital signals with two or more entries from said data structure at substantially the same time.

25. The article of claim 23, having stored thereon instructions that when executed further result in:

repeating said selecting M encoded binary digital signals and said comparing M encoded binary digital signals until said encoded binary digital signals are substantially decoded.

26. The article of claim 23, wherein the method of decoding, when executed, is capable of decoding binary digital signals that have been encoded in accordance with a Huffman code.

27. A system for decoding a series of binary digital signals, comprising:

a computing platform;

said computing platform being adapted to, in operation, perform the method of decoding a series of binary digital signals using a data structure, wherein said data structure has multiple base indices, said method comprising:

selecting N encoded binary digital signals, N being a value comprising substantially the same number of bits as the number of bits comprising an extreme code word in said data structure;

comparing said N encoded binary digital signals with two or more entries from said data structure at substantially the same time.

28. The system of claim 27, wherein said method further comprises, after the previous comparison:

selecting M encoded binary digital signals for subsequent comparisons, M being a value comprising substantially the same number of bits as the number of bits comprising an extreme code word in said data structure, minus the number of bits that were not decoded in the previous comparison; and comparing said M encoded binary digital signals with two or more entries from said data structure at substantially the same time.

29. The system of claim 27, wherein said method further comprises: repeating said selecting M encoded binary digital signals and said comparing M encoded binary digital signals until said encoded binary digital signals are substantially decoded.

30. The system of claim 27, wherein the method of decoding, when executed, is capable of decoding the binary digital signals that have been encoded in accordance with a Huffman code.

* * * * *

UNITED STATES PATENT AND TRADEMARK OFFICE
CERTIFICATE OF CORRECTION

PATENT NO. : 6,778,107 B2
DATED : August 17, 2004
INVENTOR(S) : Wang et al.

It is certified that error appears in the above-identified patent and that said Letters Patent is hereby corrected as shown below:

Column 5,
Line 45, delete "example;" and insert -- example, --.

Column 9,
Line 34, delete "To".

Column 11,
Line 6, delete "are" and insert -- and --.

Column 12,
Line 40, delete "resister" and insert -- register --.

Signed and Sealed this

Fourteenth Day of December, 2004

JON W. DUDAS
*Director of the United States Patent and Trademark Office*